United States Patent
Chang

(10) Patent No.: US 9,510,478 B2
(45) Date of Patent: Nov. 29, 2016

(54) COOLING DEVICE INCLUDING ETCHED LATERAL MICROCHANNELS

(71) Applicant: Honeywell International Inc., Morristown, NJ (US)

(72) Inventor: Steve Chang, Bothell, WA (US)

(73) Assignee: Honeywell International Inc., Morris Plains, NJ (US)

( * ) Notice: Subject to any disclaimer, the term of this patent is extended or adjusted under 35 U.S.C. 154(b) by 693 days.

(21) Appl. No.: 13/923,070

(22) Filed: Jun. 20, 2013

(65) Prior Publication Data
US 2014/0376183 A1 Dec. 25, 2014

(51) Int. Cl.
*H05K 7/20* (2006.01)
*H05K 3/06* (2006.01)
*H05K 13/00* (2006.01)
(Continued)

(52) U.S. Cl.
CPC ............... *H05K 7/20* (2013.01); *H01L 23/473* (2013.01); *H05K 3/06* (2013.01); *H05K 13/00* (2013.01); *H01L 21/4882* (2013.01); *H01L 2924/0002* (2013.01); *Y10T 29/49155* (2015.01)

(58) Field of Classification Search
CPC ............... H05K 7/20; H05K 7/20263; H05K 7/20272; H05K 3/06; H05K 13/00; H01L 31/022; H01L 31/023; H01L 31/055; H01L 23/34; G06F 1/20; G06F 1/206; F25D 23/34
USPC ............... 361/679.46, 679.53, 689, 698, 699, 361/704–712; 165/80.2, 80.4, 80.5, 104.33, 165/185; 174/16.3, 252; 257/706, 713, 714, 257/718; 438/106–110, 406; 136/244, 246, 136/245, 255
See application file for complete search history.

(56) References Cited

U.S. PATENT DOCUMENTS 4,200,472 A * 4/1980 Chappell ............... H01L 31/052
136/246
4,295,002 A * 10/1981 Chappell ......... H01L 31/035281
136/244
(Continued)

FOREIGN PATENT DOCUMENTS

WO 2011068470 A1 6/2011

OTHER PUBLICATIONS

Gantz, "Fabrication of Three-Dimensionally Independent Microchannels Using a Single Mask Aimed at On-Chip Microprocessor Cooling," thesis submitted to Virginia Polytechnic Institute and State University, Nov. 28, 2007, 50 pp.
(Continued)

*Primary Examiner* — Michail V Datskovskiy
(74) *Attorney, Agent, or Firm* — Shumaker & Sieffert, P.A.

(57) ABSTRACT

In some examples, a cooling system includes a silicon substrate defining a first trench, a second trench, and a plurality of channels extending between the first trench and the second trench. The silicon substrate may define a first surface and a second surface substantially opposite to and substantially parallel to the first surface, and each of the plurality of channels may extend substantially parallel to the surface of the silicon substrate. The cooling system also may include a microelectronic device comprising a heat-generating area. The microelectronic device may be attached to the first surface or the second surface of the silicon substrate. In some examples, the plurality of channels may be etched between the first trench and the second trench.

10 Claims, 12 Drawing Sheets

(51) Int. Cl.
*H01L 23/473* (2006.01)
*G06F 1/20* (2006.01)
*H01L 21/48* (2006.01)

(56) References Cited

U.S. PATENT DOCUMENTS

| | | | | |
|---|---|---|---|---|
| 4,376,872 A | * | 3/1983 | Evans | H01L 31/03529 136/249 |
| 4,379,944 A | * | 4/1983 | Borden | H01L 31/0236 136/246 |
| 4,453,030 A | * | 6/1984 | David | H01L 31/022425 136/255 |
| 5,704,992 A | * | 1/1998 | Willeke | B01D 29/012 136/255 |
| 5,828,683 A | * | 10/1998 | Freitas | H01S 5/4031 372/108 |
| 5,930,279 A | * | 7/1999 | Apollonov | H01S 5/02236 257/88 |
| 5,998,240 A | | 12/1999 | Hamilton et al. | |
| 6,096,656 A | | 8/2000 | Matzke et al. | |
| 6,582,987 B2 | | 6/2003 | Jun et al. | |
| 6,773,952 B2 | | 8/2004 | Armbrust et al. | |
| 7,017,654 B2 | | 3/2006 | Kenny et al. | |
| 7,353,859 B2 | | 4/2008 | Stevanovic et al. | |
| 7,427,566 B2 | | 9/2008 | Durocher et al. | |
| 7,435,623 B2 | | 10/2008 | Chrysler et al. | |
| 7,498,508 B2 | * | 3/2009 | Rubin | H01L 31/022425 136/249 |
| 7,652,372 B2 | | 1/2010 | Dishongh et al. | |
| 7,705,342 B2 | | 4/2010 | Henderson et al. | |
| 7,772,117 B2 | * | 8/2010 | Tu | H01L 21/76 438/406 |
| 7,836,597 B2 | | 11/2010 | Datta et al. | |
| 7,898,807 B2 | | 3/2011 | Beaupre et al. | |
| 8,299,563 B2 | | 10/2012 | Gambino et al. | |
| 8,350,317 B2 | | 1/2013 | Kocon | |
| 8,490,678 B2 | * | 7/2013 | Kim | F28F 3/048 165/170 |
| 2007/0117345 A1 | * | 5/2007 | Tu | H01L 21/76 438/406 |
| 2011/0073292 A1 | | 3/2011 | Datta et al. | |
| 2012/0129354 A1 | | 5/2012 | Luong | |
| 2013/0021789 A1 | | 1/2013 | Dahm | |

OTHER PUBLICATIONS

Henry, "ICP Etching of Silicon for Micro and Nanoscale Devices," thesis submitted to the California Institute of Technology, May 19, 2010, 219 pp.

Jiang et al., "Closed-Loop Electroosmotic Microchannel Cooling System for VLSI Circuits," IEEE transactions on Components and Packaging Technologies, vol. 25, No. 3, Sep. 2002, pp. 347-355.

Joo et al., "Air cooling of a microelectronic chip with diverging metal microchannels monolithically processed using a single mask," Journal of Micomechanics and Microengineering, Oct. 7, 2008, 13 pp.

Perry et al., "Fouling and its mitigation in silicon microchannels used for IC chip cooling," Microfluid Nanofluid, Jan. 8, 2008, pp. 357-371.

Shearn, et al., "Advanced Plasma Processing: Etching, Deposition, and Wafer Bonding Techniques for Semiconductor Applications," Semiconductor Technologies, Apr. 2010, 27 pp.

* cited by examiner

COOLING DEVICE INCLUDING ETCHED LATERAL MICROCHANNELS

TECHNICAL FIELD

The disclosure describes cooling devices for microelectronic chips and techniques for forming such cooling devices.

BACKGROUND

Microelectronic chips produce heat due to electrical resistance of the chip. In some examples, microelectronic chips may be cooled by conduction to a heat spreader or a heat sink and/or by convection. In some examples, however, such cooling mechanisms may not be sufficient to cool the microelectronic chip and/or may occupy too large a volume for the size of the system in which the microelectronic ship is being utilized.

SUMMARY

This disclosure describes cooling devices for microelectronic chips and techniques for forming such cooling devices. The cooling devices each include a substrate defining a first trench, a second trench, and a plurality of fluidic channels extending between the first trench and the second trench. In some examples, the fluidic channels of the plurality of fluidic channels are oriented substantially parallel to a major surface of the substrate. By including a plurality of fluidic channels extending substantially parallel to the major surface of the substrate, the major surface of the substrate may be attached to a microelectronic chip, and an effective cooling area of the cooling device may be increased, e.g., compared to a cooling device in which cooling channels do not run substantially parallel to the major surface of the substrate. This may allow the cooling device to effectively cool the attached microelectronic chip.

In some examples, the substrate may include silicon. By using silicon as the substrate, photolithography processes, such as chemical etching, may be used to form the trenches and fluidic channels. Additionally, the substrate of the cooling device may be attached to a semiconductor substrate of the microelectronic device to be cooled using the cooling device, which may facilitate effective cooling of the microelectronic device.

In one example, the disclosure describes a method for forming a cooling device. The method may include forming a first trench comprising a first sloped wall and a second sloped wall in a substrate. The method also may include forming a second trench comprising a third sloped wall and a fourth sloped wall in the substrate. The third sloped wall may be adjacent to the second sloped wall. In accordance with this example, the method also includes depositing a metal on the first sloped wall, the second sloped wall, and the third sloped wall. The method further includes forming a plurality of apertures in the metal on the second sloped wall and etching a plurality of channels between the second sloped wall and the third sloped wall.

In another example, the disclosure describes a cooling system comprising a silicon substrate defining a first trench, a second trench, and a plurality of channels extending between the first trench and the second trench. In accordance with this aspect of the disclosure, the silicon substrate also defines a first surface and a second surface substantially opposite to and substantially parallel to the first surface, and each of the plurality of channels extends substantially parallel to the surface of the silicon substrate. The cooling system also may include a microelectronic device comprising a heat-generating area, wherein the microelectronic device is attached to the first surface or the second surface of the silicon substrate. The heat-generating area is adjacent to the first surface or the second surface and at a position between the first trench and the second trench.

In another example, the disclosure describes a system comprising a silicon substrate defining a first trench and a second trench. The first trench may comprise a first sloped wall and a second sloped wall, and the second trench may comprise a third sloped wall and a fourth sloped wall. The second sloped wall may be adjacent to the third sloped wall. In accordance with this example, the system also may include a first metal layer formed on the first sloped wall and the second sloped wall and a second metal layer formed on the third sloped wall.

The details of one or more examples are set forth in the accompanying drawings and the description below. Other features, objects, and advantages will be apparent from the description and drawings, and from the claims.

DETAILED DESCRIPTION

Examples of cooling devices for microelectronic chips and techniques for forming such cooling devices are described herein. The cooling devices each include a substrate defining a first trench, a second trench, and a plurality of fluidic channels extending between the first trench and the second trench. In some examples, at least some fluidic channels of the plurality of fluidic channels are oriented substantially parallel to a major surface of the substrate. By including a plurality of fluidic channels, at least some of which extend substantially parallel to the major surface of the substrate, the major surface of the substrate may be attached to a microelectronic chip, and an effective cooling area of the cooling device may be increased, e.g., compared to a cooling device in which cooling channels do not run substantially parallel to the major surface of the substrate. This may allow the cooling device to more effectively cool the attached microelectronic chip.

In some examples, the substrate may include a semiconductor substrate material, such as, for example, silicon. By using silicon as the substrate, photolithography processes, such as chemical etching, may be used to form the trenches and fluidic channels. In some implementations, the semiconductor substrate of the cooling device may be attached to a semiconductor substrate of the microelectronic device to be cooled, which may facilitate effective cooling of the microelectronic device.

Figure 1:
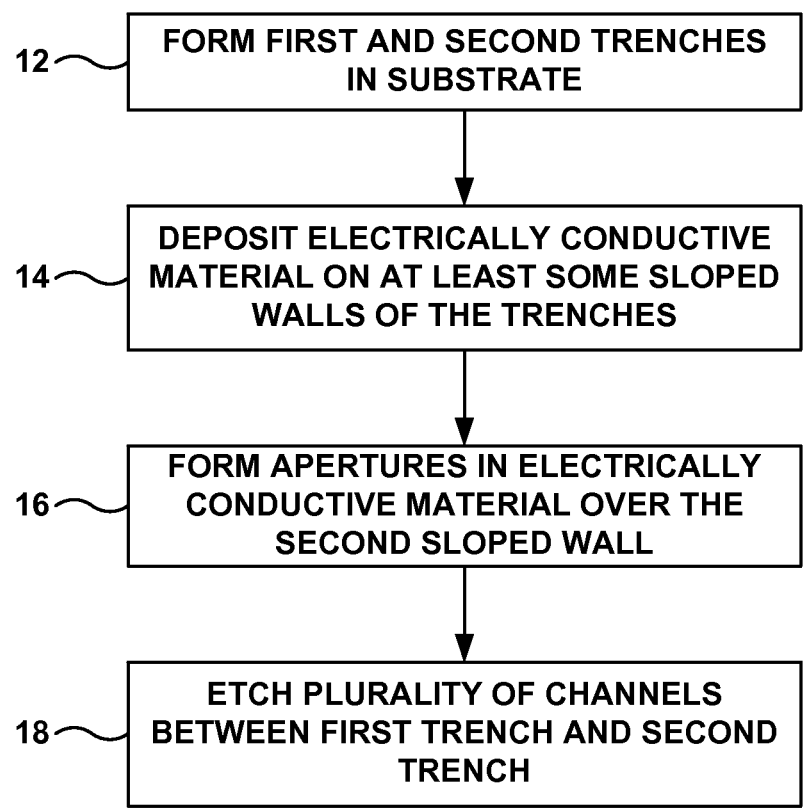
FIG. 1 is a flow diagram illustrating an example of a technique for forming a cooling device including a plurality of fluidic channels extending substantially parallel to a major surface of the cooling device.

FIG. 1 is a flow diagram illustrating an example of a technique for forming a cooling device including a plurality of fluidic channels extending substantially parallel to a major surface of the cooling device. For purposes of illustration only, the technique of FIG. 1 will be described with concurrent reference to the conceptual and schematic block diagrams shown in FIGS. 2A-2G.

Figure 2A:
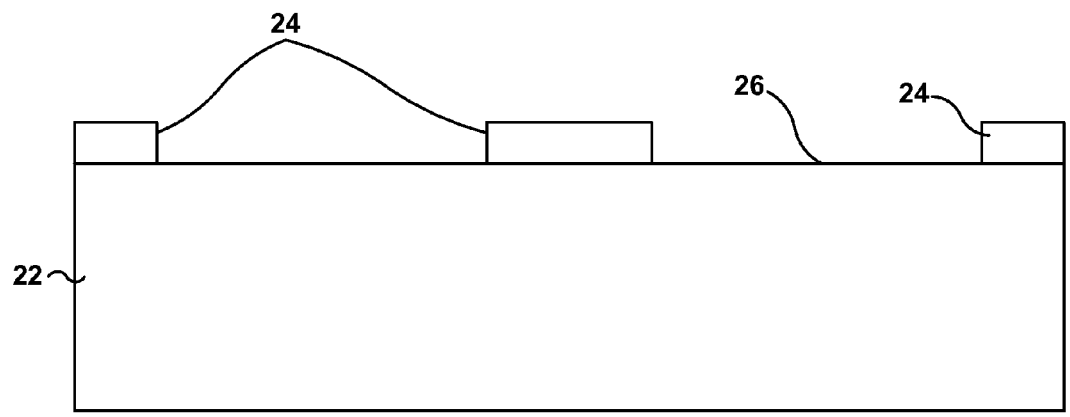
FIGS. 2A-2H are conceptual and schematic block diagrams illustrating various steps of the example technique of FIG. 1.

The technique of FIG. 1 includes forming first and second trenches in a substrate 22 (12). In some examples, substrate 22 includes silicon. In some instances in which the substrate includes silicon, as shown conceptually in FIGS. 2A and 2B, forming the first and second trenches may include masking and etching. Initially, a photoresist may be deposited on a surface 26 of a substrate 22. In some examples, surface 26 may be a (100) surface of a substrate 22 that includes silicon. The photoresist may be exposed to suitable light source in a predetermined pattern to develop the photoresist. The predetermined pattern may correspond to the shape of the trenches at surface 26, in which photoresist over the eventual location of the trenches is left unexposed and the remaining photoresist is exposed. Excess and undeveloped photoresist then may be removed, leaving the patterned, exposed photoresist 24 formed on surface 26, as shown in FIG. 2A. In some examples, an oxide or mask layer is present on surface 26 under the patterned photoresist.

Figure 2B:
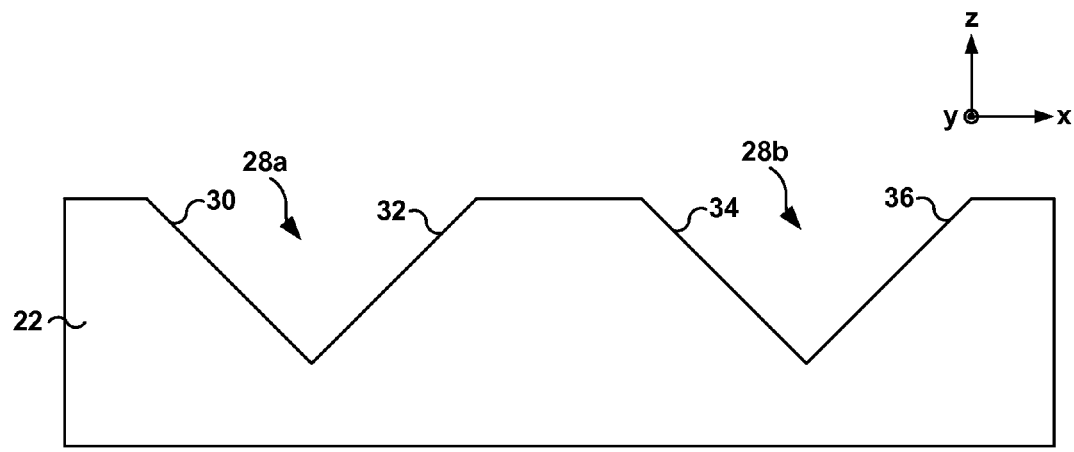

Portions of substrate 22 then may be etched to form first trench 28a and second trench 28b (collectively, "trenches 28"), as shown in FIG. 2B. Although not shown in FIG. 2B, trenches 28 may be generally rectangular in shape, as viewed above from above surface 26, e.g., in the x-y plane (where orthogonal x-y-x axes are shown in FIG. 2B for sake of illustration only). Additionally, in some examples, trenches 28 may extend substantially parallel to each other, e.g., in the direction of the y-axis shown in FIG. 2B. As shown in FIG. 2B, first trench 28a includes first sloped wall 30 and second sloped wall 32. Similarly, second trench 28b includes third sloped wall 34 and fourth sloped wall 36. Second sloped wall 32 of first trench 28a may be adjacent to (e.g., next to) third sloped wall 34 of second trench 28b. Any of these features of trenches 28 may be used in combination with each other.

Sloped walls 30, 32, 34, and 36 may be formed by anisotropic etching of substrate 22. For example, various etchants may anisotropically etch silicon, such that a resulting structure after etching includes sloped walls. Example etchants that anisotropically etch silicon include potassium hydroxide (KOH), ethylenediamine pyrocatechol (EDP), tetramethylammonium hydroxide (TMAH). KOH may have etch silicon in the <100> direction at a rate about 400 times higher than in the <111> direction. EDP may have a <100>/<111> selectivity of about 17×. TMAH may have a selectivity between {100} and {111} planes of about 37×.

As shown in FIG. 2B, if the etching is allowed to proceed to completion, trenches 28 may include a v-shaped cross-section (e.g., in the x-z plane in the example shown in FIG. 2B). Depending on the shape and/or size of first trench 28a and second trench 28b at surface 26 (e.g., in the x-y plane of FIG. 2B), the points of first trench 28a and second trench 28b may or may not align in the z-axis direction of FIG. 2B. For example, if the shapes and sizes of first trench 28a and second trench 28b at surface 26 are substantially the same, first trench 28a and second trench 28b may have substantially similar cross-sectional profiles in the x-z and y-z planes of FIG. 2B. However, if the shapes and/or sizes of first trench 28a and second trench 28b at surface 26 are different, first trench 28a and second trench 28b may have different cross-sectional profiles in the x-z and/or the y-z planes of FIG. 2B. In some examples, if etching is stopped before completion, trenches 28 may include substantially flat bottoms that are substantially parallel to surface 26.

Once trenches 28 have been formed (12), a metal layer 38 (shown in FIG. 2C) may be deposited on first sloped wall 30, second sloped wall 32, third sloped wall 34, and, optionally, on fourth sloped wall 36 (14). In some examples, metal layer 38 may be deposited directly on substrate 22, e.g., directly on the silicon. In other examples, a layer of electrical insulator, such as silicon oxide, first may be formed on at least a portion of substrate 22, e.g., on the horizontal surfaces of surface 26 and on fourth sloped wall 36, and metal layer 38 may be deposited on at least some portions of the layer of insulator. In some examples, metal layer 38 may include, for example, gold, platinum, chromium, tungsten, or the like. Metal layer 38 may be deposited using any of a variety of processes, such as, for example, a physical vapor deposition (PVD) process, a chemical vapor deposition (CVD) process, sputtering, or the like.

Figure 2C:
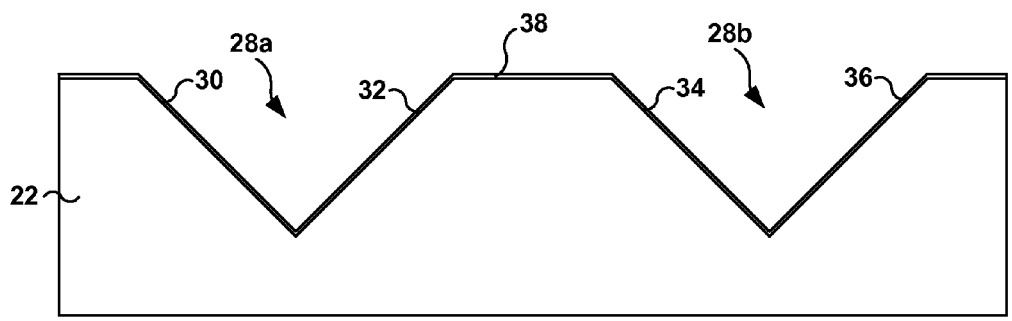

Metal layer 38 may be deposited on at least portions of first sloped wall 30, second sloped wall 32, third sloped wall 34, and, optionally, fourth sloped wall 36, directly on substrate 22 (e.g., silicon) or on the layer of insulator. Metal layer 38 may function as an electrical contact for a voltage supply during subsequent processing, a mirror for reflecting light radiation, and a mask for preventing etching of covered portions of substrate 22, as will be described below. In some examples, as shown in FIG. 2C, metal layer 38 may substantially fully cover first sloped wall 30, second sloped wall 32, third sloped wall 34, and fourth sloped wall 36.

Figure 2D:
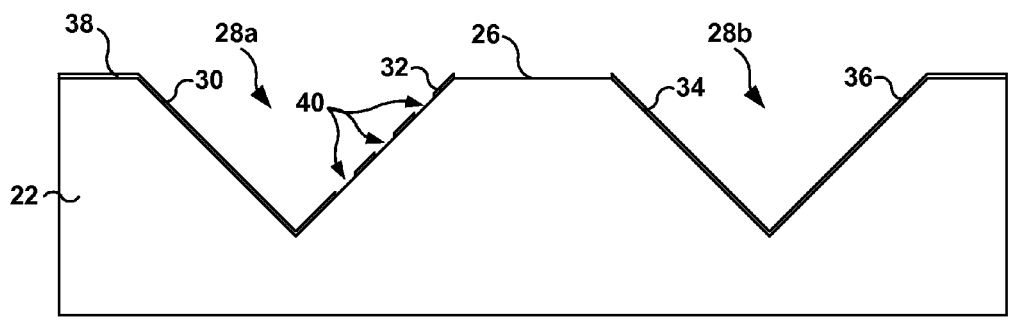

As shown in FIG. 2D, after depositing metal layer 38 (14), a plurality of apertures may be formed in metal layer 38 over second sloped wall 32 (16). In some examples, the plurality of apertures may be formed by first covering surface 26, first sloped wall 30, second sloped wall 32, third sloped wall 34, and fourth sloped wall 36 with a photoresist. The photoresist may be exposed to suitable light radiation in a predetermined pattern to develop the photoresist. The predetermined pattern may correspond to the shape of the apertures in metal layer 38 at second sloped wall 32, in which photoresist over the eventual location of the apertures is left unexposed and the remaining photoresist is exposed. In some examples, the predetermined pattern also may include an undeveloped portion between first trench 28a and second trench 28b, which will result in removal of metal from the space between first trench 28a and second trench 28b, thereby electrically separating the electrically conductive material in metal layer 38 over first trench 28a from the electrically conductive material in metal layer 38 over second trench 28b. Excess and undeveloped photoresist then may be removed, leaving the patterned, exposed photoresist.

The exposed portions of metal layer 38 then may be etched using a suitable etchant selective for the material in metal layer 38. For example, when metal layer 38 includes gold or platinum, the etchant may include aqua regia (a mixture of nitric acid and hydrochloric acid).

After the etching of metal layer 38 and removal of the photoresist is complete, the resulting structure is as shown in FIG. 2D, in which a plurality of apertures 40 extending to substrate 22 are formed in metal layer 38 at second sloped wall 32. Apertures 40 may correspond to locations at which substrate 22 may be etched to form fluidic channels in substrate 22. Although three apertures 46 are shown in FIG. 2D, in other examples, more than three apertures, such as at least three apertures, may be formed in metal layer 38 over second sloped wall 32. Additionally, as shown in FIG. 2D, metal layer 38 has been removed from surface 26 between first trench 28a and second trench 28b.

Figure 2E:
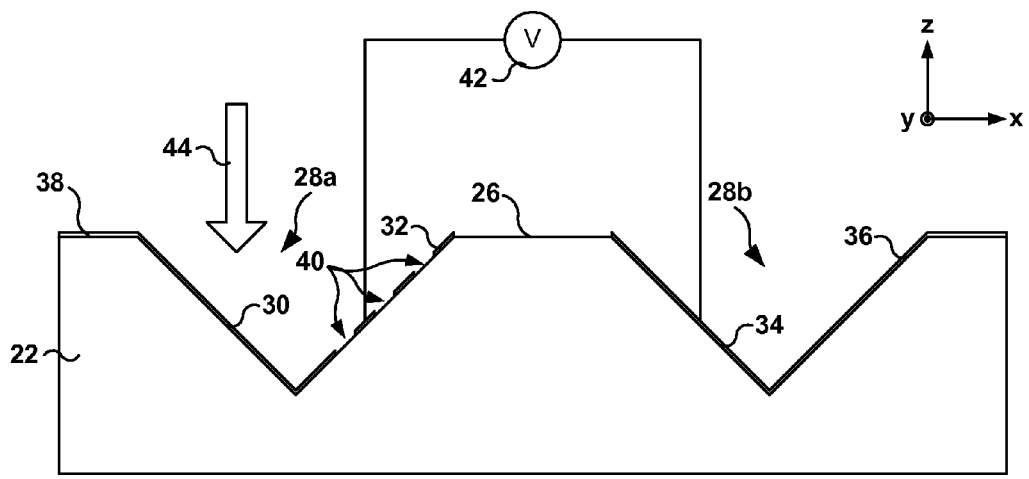

The technique of FIG. 1 also may include etching a plurality of channels between first trench 28a and second trench 28b (18). The number of channels corresponds to the number of apertures formed in metal layer 38. In some examples, exposed surface of substrate 22 not to be etched (e.g., exposed portions of surface 26) may be masked with an oxide or other insulator to prevent etching of these portions of substrate 22 during the etching of the plurality of channels. The etching process may be performed by exposing substrate 22 to a chemical etchant at apertures 40. In some examples, the etchant includes hydrofluoric acid. As shown in FIG. 2E, the etching process may include attaching a voltage source 42 between a first electrode proximate to the portion of metal layer 38 at first trench 28a and a second electrode electrically coupled to the portion of metal layer 38 or etchant at second trench 28b. As discussed above, the portions of metal layer 38 at first trench 28a may be electrically isolated from the portion of metal layer 38 at second trench 28b in some examples, such as the example shown in FIG. 2E. In some examples, the second electrode electrically coupled to metal layer 38 at second trench 28b may act as an anode and the first electrode proximate to metal layer 38 at first trench 28a may act as a cathode when the voltage is supplied from voltage source 42.

Etching the plurality of channels between first trench 28a and second trench 28b (18) also can include directing light radiation 44 (e.g., light) at first sloped wall 30. As metal layer 38 may be reflective, metal layer 38 at first sloped wall 30 may reflect at least some of light radiation 44 towards apertures 40. In some examples, the angle of first sloped wall 30 and the angle of incidence of light radiation 44 may be selected such that at least some of the radiation reflected by metal layer 38 at sloped wall 30 is directed toward apertures 40 in a direction substantially parallel to surface 26 (e.g., substantially parallel to the x-axis in FIG. 2E, where orthogonal x-y-z axes are shown in FIG. 2E for purposes of illustration only).

Figure 2F:
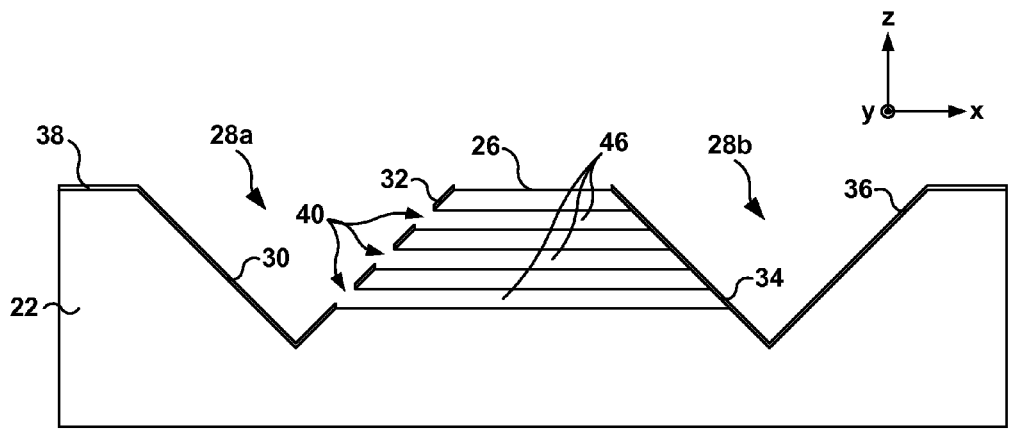

The combination of the applied voltage difference and the reflected light radiation 44 may influence the direction of etching when substrate 22 is exposed to the chemical etchant. For example, the electric field generated by the applied voltage between the first electrode proximate to metal layer 38 at first trench 28a and the second electrode electrically coupled to metal layer 38 at second trench 28b may influence the direction of etching as the chemical etchant, causing the etching to occur in a direction substantially parallel to surface 26 between apertures 40 and second trench 28b. Similarly, the reflected light radiation 44 may activate the chemical etchant, and may be directed substantially parallel to surface 26. As shown in FIG. 2F, this may result in a plurality of channels 46 formed in substrate 22. Each of the plurality of channels 46 extends from a respective one of apertures 40 to metal layer 38 at third sloped wall 34. Channels 46 may extend substantially parallel (e.g., parallel or nearly parallel) to surface 26 (e.g., in the x-axis direction of FIG. 2F, where orthogonal x-y-z axes are shown in FIG. 2F and the other figures for purposes of illustration only).

Figure 2G:
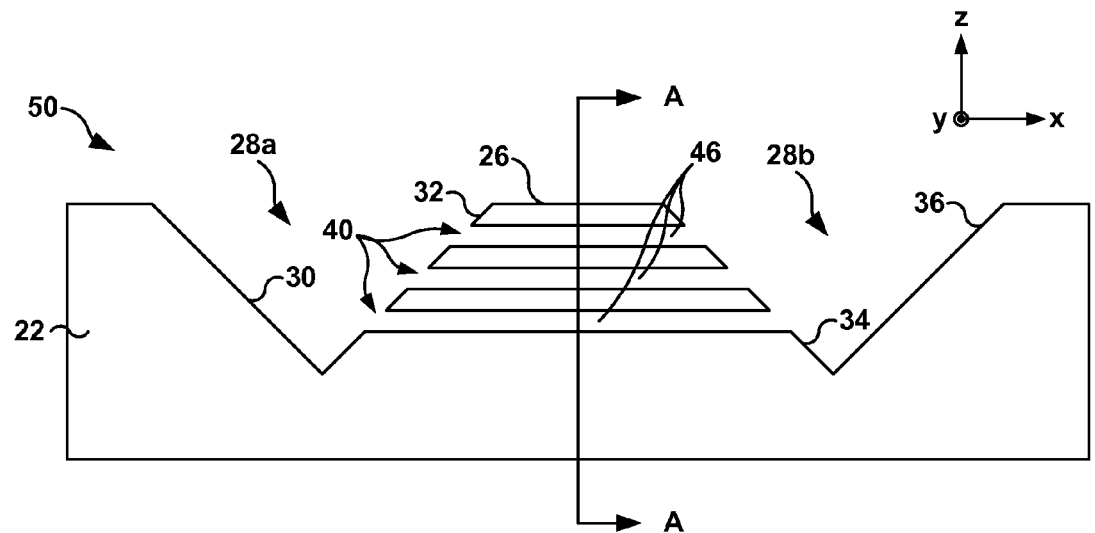
Figure 2H:
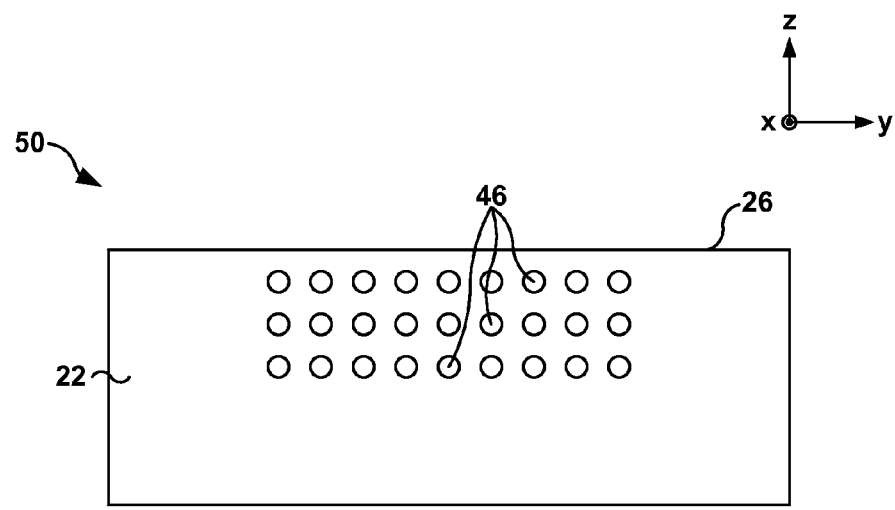

Once channels 46 have been etched in substrate 22, metal layer 38 may be removed from substrate 22, using, for example, wet etching with a chemical etchant selective for the material which metal layer 38 comprises. The resulting cooling device 50 is shown in FIGS. 2G and 2H. As shown in FIG. 2G, channels 46 extend between first trench 28a and second trench 28b, and lie substantially parallel to surface 26. FIG. 2H is a conceptual and schematic block diagrams illustrating a view of cooling device 50 taken along cross-sectional line A-A shown in FIG. 2G. As shown in FIG. 2H, plurality of channels 46 include more than three channels, and are spaced along the y-axis direction of FIG. 2H (where orthogonal x-y-z axes are shown in FIG. 2H for purposes of illustration only), in addition to being spaced along the z-axis direction of FIG. 2H. As each channel of plurality of channels 46 extends from a respective aperture of plurality of apertures 40, cooling device 50 includes the same number of apertures 40 as cooling channels 46.

Cooling device 50 may be used to cool microelectronic devices, such as integrated circuits, substrates including through silicon vias (TSVs), or the like. As channels 46 extend substantially parallel to surface 26, a cooling area, in which channels 46 are adjacent to surface 26, may be larger than in cooling devices in which the cooling channels extend perpendicular to surface 26.

Figure 3:
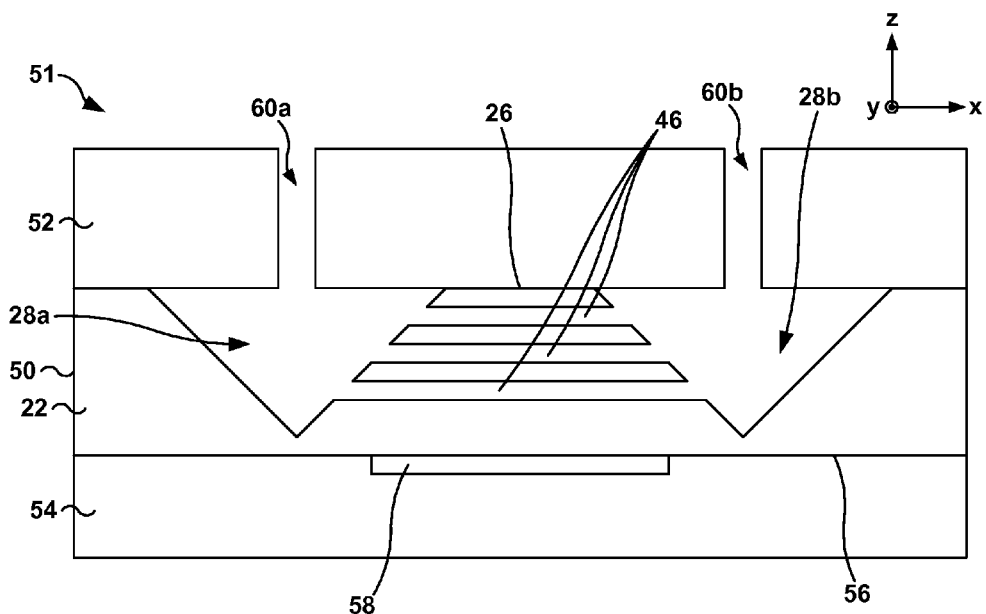
FIG. 3 is a conceptual and schematic block diagram illustrating an example of a cooling device implemented in an open system.

In some examples, cooling device 50 may be attached to at least one other substrate to form a cooling system. For example, FIG. 3 is a conceptual and schematic block diagram illustrating cooling device 50 implemented in an open cooling system 51. In the example of FIG. 3, cooling device 50 is attached to a second substrate 52 and a third substrate 54. Second substrate 52 may be attached to surface 26 of cooling device 50, and may define first channel 60a and second channel 60b, which extend through a thickness of second substrate 52 (extending in the z-axis direction in FIG. 3). First channel 60a and second channel 60b may fluidly connect to a fluid source and fluid sink (which may be the same structure, such as a coolant reservoir), and may fluidically connect trenches 28 and channels 46 to the fluid source and fluid sink.

Third substrate 54 may be attached to surface 56 of cooling device 50, which is substantially opposite to and substantially parallel to surface 26 of cooling device 50. Third substrate 54 may be a substrate of a microelectronic device, and includes heat-generating area 58, which may include heat-generating circuitry, such as transistors or the like, which may generate heat during operation. As shown in FIG. 3, heat-generating area 58 is adjacent to channels 46 (e.g., is located adjacent to surface 56 between first trench 28a and second trench 28b). This allows heat to be transferred from heat-generating area 58 to substrate 22 of cooling device 50. Substrate 22 may include a thermally conductive material, such as silicon, and may thus be an effective heat sink. Heat in substrate 22 may be transferred to a coolant flowing through channels 46 (e.g., from first trench 28a to second trench 28b or vice versa). In this way, cooling device 50 may be a cooling device for heat-generating area 58. In some examples, as shown in FIG. 3, the distance between first trench 28a and second trench 28b at the points of first trench 28a and second trench 28b closest to second surface 56 (to which third substrate 54 is attached), measured in the direction of the x-axis of FIG. 3, is greater than a length of heat-generating area 58 (measured in the direction of the x-axis of FIG. 3).

In some examples, cooling system 51 may be designed such that it is a single-phase cooling system, in which the cooling fluid exists as substantially a single phase (e.g., liquid or gas) throughout the cooling system. In other examples, cooling system 51 may be designed such that it is a multi-phase (e.g., dual-phase) cooling system, in which the cooling fluid changed phases (e.g., from liquid to gas) as the cooling fluid flows through channels 46, and then is cooled to return to the liquid phase, e.g., at the reservoir or an external radiator.

Figure 4:
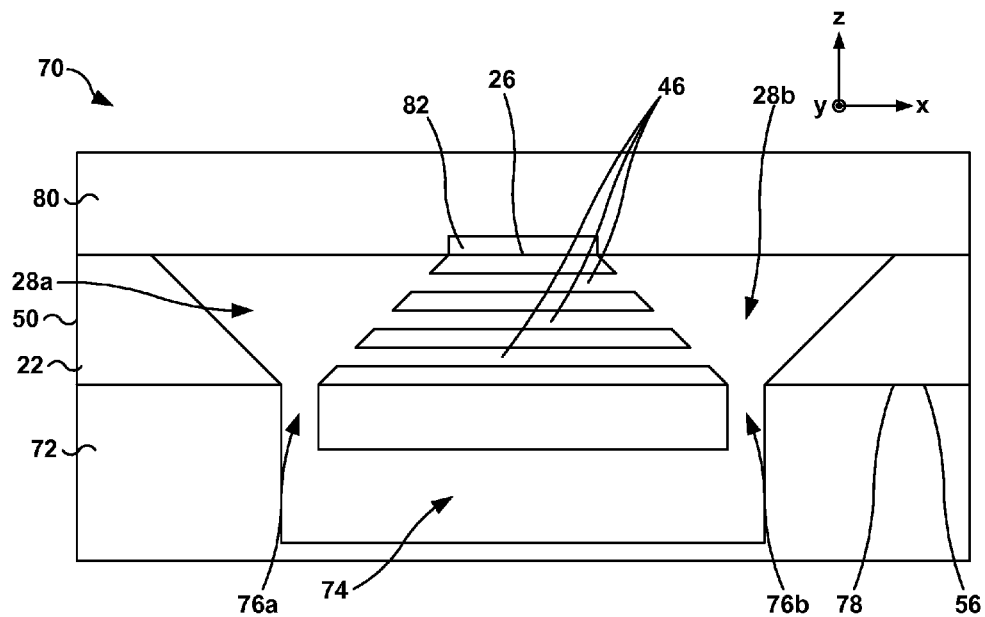
FIG. 4 is a conceptual and schematic block diagram illustrating an example of a cooling device implemented in a closed system.

FIG. 3 illustrates an example in which cooling device 50 is implemented in an open system, e.g., in which cooling fluid flows to an external reservoir, and, in some examples, may be pumped through channels 46. In other examples, cooling device 50 may be implemented in a closed system. FIG. 4 is a conceptual and schematic diagram illustrating an example of cooling device 50 implemented in a closed cooling system 70.

Closed cooling system 70 includes cooling device 50, second substrate 72, and third substrate 80. Second substrate 72 defines a cavity 74, a first channel 76a, and a second channel 76b. First channel 76a and second channel 76b extend from cavity 74 to surface 78 of second substrate 72.

Surface 78 of second substrate 72 is attached to second surface 56 of cooling device 50. As shown in FIG. 4, first trench 28a and second trench 28b extend to second surface 56 of substrate 22. In this way, first channel 76a fluidly connects cavity 74 to first trench 28a and second channel 76b fluidly connects cavity 74 to second trench 28b. Together, cavity 74, first channel 76a, first trench 28a, channels 46, second trench 28b, and second channel 76b from a fluid circuit through which cooling fluid can flow.

First surface 26 of cooling device 50 is attached to third substrate 80. Third substrate 80 may be a substrate of a microelectronic device, and includes heat-generating area 82, which may include heat-generating circuitry, such as transistors or the like. As shown in FIG. 4, heat-generating area 82 is disposed adjacent to channels 46 (e.g., is located adjacent to first surface 26 between first trench 28a and second trench 28b). This allows heat to be transferred from heat-generating area 82 to substrate 22 of cooling device 50. Substrate 22 may include a thermally conductive material, such as silicon, and may thus be an effective heat sink. Heat in substrate 22 may be transferred to a coolant flowing through channels 46 (e.g., from first trench 28a to second trench 28b or vice versa). In this way, cooling device 50 may be a cooling device for heat-generating area 82. In some examples, as shown in FIG. 4, the distance between first trench 28a and second trench 28b at the points of first trench 28a and second trench 28b closest to first surface 26 (to which third substrate 80 is attached), measured in the direction of the x-axis of FIG. 4, is greater than or substantially equal to a length of heat-generating area 82 (measured in the direction of the x-axis of FIG. 4).

In some examples, cooling system 70 may be designed such that it is a single-phase cooling system, in which the cooling fluid exists as substantially a single phase (e.g., liquid or gas) throughout the cooling system. In other examples, cooling system 70 may be designed such that it is a multi-phase (e.g., dual-phase) cooling system, in which the cooling fluid changed phases (e.g., from liquid to gas) as the cooling fluid flows through channels 46, and then is cooled to return to the liquid phase, e.g., at the reservoir (e.g., cavity 74) or an external radiator.

In either case, cooling system 70 is a closed system that may rely upon thermal gradient-driven convection to drive the flow of fluid through cavity 74, first channel 76a, first trench 28a, channels 46, second trench 28b, and second channel 76b. For example, cooling fluid may flow from first trench 28a through channels 46, at which point the cooling fluid is heated due to heat transfer from heat-generating area 82 via substrate 22. As the cooling fluid flows into second trench 28b, the cooling fluid may begin to cool, which may increase the density of the fluid, and cause the fluid to sink (e.g., when cavity 74 is located below second trench 28b relative to gravity). This may force fluid from cavity 74 through first channel 76a and into first trench 28a. This process may be particularly effective at driving flow when the cooling fluid changes phases, e.g., from a liquid to a gas, as the fluid flows through channels 46, and then condenses in second trench 28b.

Figure 5:
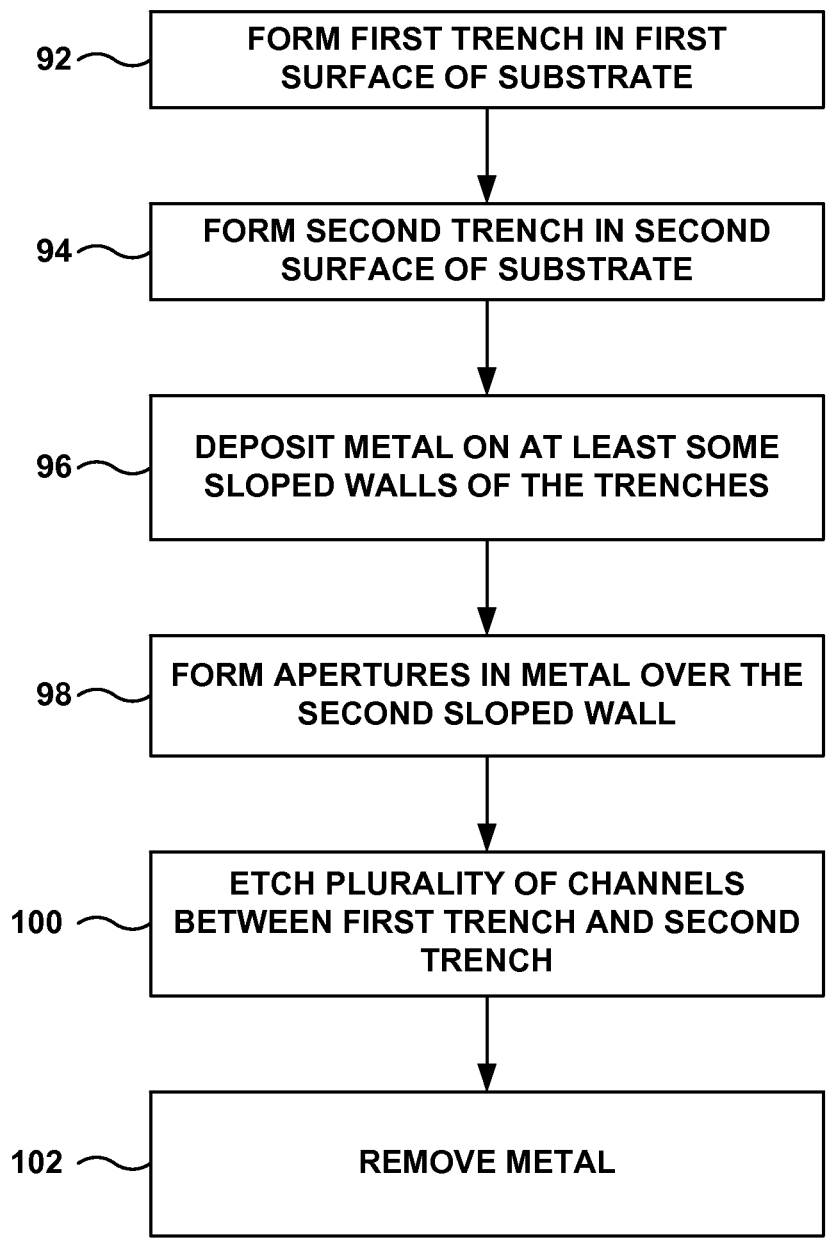
FIG. 5 is a flow diagram illustrating an example of a technique for forming a cooling device including a plurality of fluidic channels extending substantially parallel to a major surface of the cooling device.

FIGS. 1-4 illustrate examples in which the first trench 28a and second trench 28b are formed in the same surface of substrate 22. However, in other examples, the first trench and second trench need not be formed in the same surface of a substrate. FIG. 5 is a flow diagram illustrating an example of a technique for forming a cooling device including a plurality of fluidic channels extending substantially parallel to a major surface of the cooling device. For purposes of illustration only, the technique of FIG. 5 will be described with concurrent reference to the conceptual and schematic block diagrams shown in FIGS. 6A-6I.

Figure 6A:
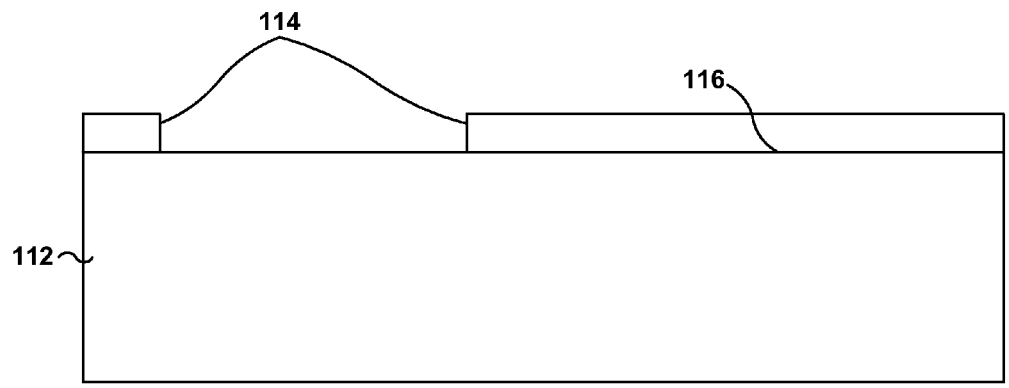
FIGS. 6A-6I are conceptual and schematic block diagrams illustrating various steps of the example technique of FIG. 5.

The technique of FIG. 5 includes forming a first trench in a first surface of a substrate 112 (92). Substrate 112 may include silicon in some examples. As shown in FIG. 6A, forming the first and second trenches may include masking and etching. Initially, a photoresist may be deposited on a first surface 116 of substrate 112. In some examples, first surface 116 may be a (100) surface of a substrate 112 that includes silicon. The photoresist then may be developed and excess and undeveloped photoresist then may be removed, leaving the patterned, exposed photoresist 114 formed on first surface 116, as shown in FIG. 6A. In some examples, an oxide or mask layer is present on first surface 116 under the patterned photoresist.

Figure 6B:
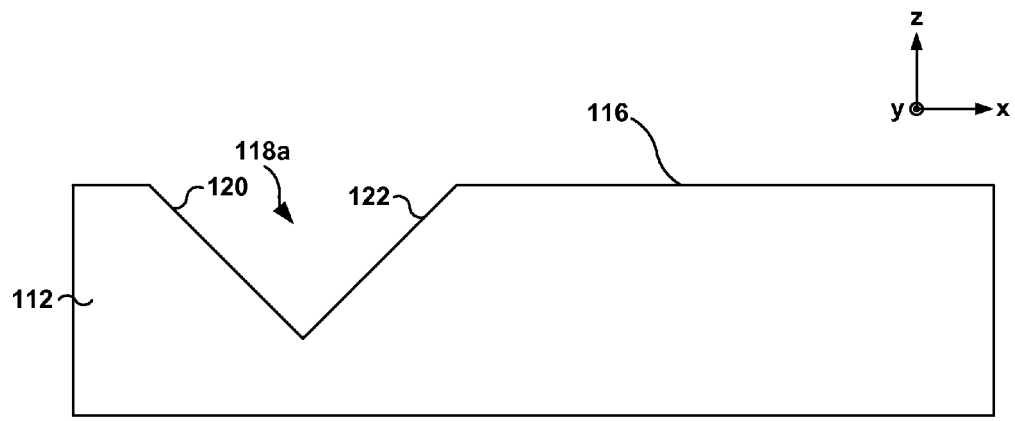

Portions of substrate 112 then may be etched to form first trench 118a, which includes first sloped wall 120 and second sloped wall 122, as shown in FIG. 6B. First trench 118a may be formed by anisotropic etching of substrate 22. For example, various etchants may anisotropically etch silicon, such that a resulting structure after etching includes sloped walls. Example etchants that anisotropically etch silicon include potassium hydroxide (KOH), ethylenediamine pyrocatechol (EDP), tetramethylammonium hydroxide (TMAH). KOH may have etch silicon in the <100> direction at a rate about 400 times higher than in the <111> direction. EDP may have a <100>/<111> selectivity of abut 17×. TMAH may have a selectivity between {100} and {111} planes of about 37×.

As shown in FIG. 6B, if the etching is allowed to proceed to completion, first trench 118a may include a v-shaped cross-section (taken along the x-z plane). However, if etching is stopped before completion, trench 118a may include a substantially flat bottom (e.g., substantially planar in the x-y plane) substantially parallel to first surface 116. After the etching is complete, the patterned, exposed photoresist 114 may be removed, leaving first surface 116 uncovered.

Figure 6C:
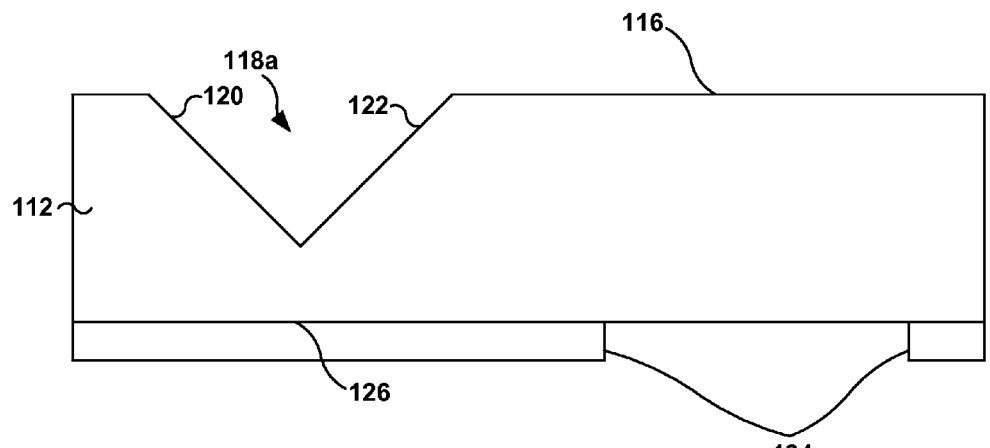
Figure 6D:
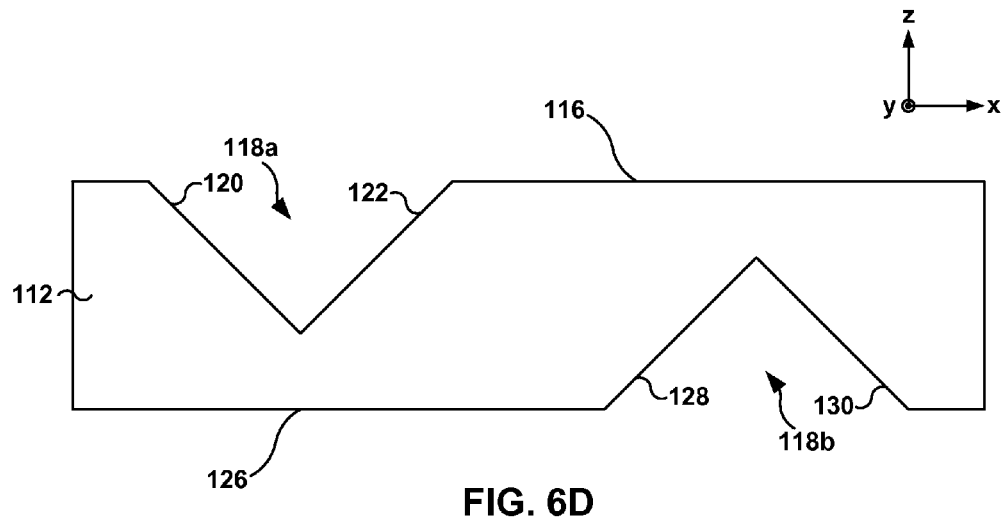

Once first trench 118a has been formed in first surface 116, second trench 118b may be formed in second surface 126 of substrate 112 (94). As shown in FIGS. 6C and 6D, in some examples, forming second trench 118b may include masking and etching, similar to the technique used to form first trench 118a. Initially, a photoresist may be deposited on a second surface 126 of substrate 112. In some examples, second surface 126 may be a (100) surface of a substrate 112 that includes silicon. The photoresist then may be developed and excess and undeveloped photoresist then may be removed, leaving the patterned, exposed photoresist 124 formed on second surface 126, as shown in FIG. 6C. In some examples, an oxide or mask layer is present on second surface 126 under the patterned photoresist.

Portions of substrate 112 then may be anisotropically etched to form second trench 118b, which includes third sloped wall 128 and fourth sloped wall 130, as shown in FIG. 6D. After the etching is complete, the patterned, exposed photoresist 124 may be removed, leaving second surface 126 uncovered.

Figure 6E:
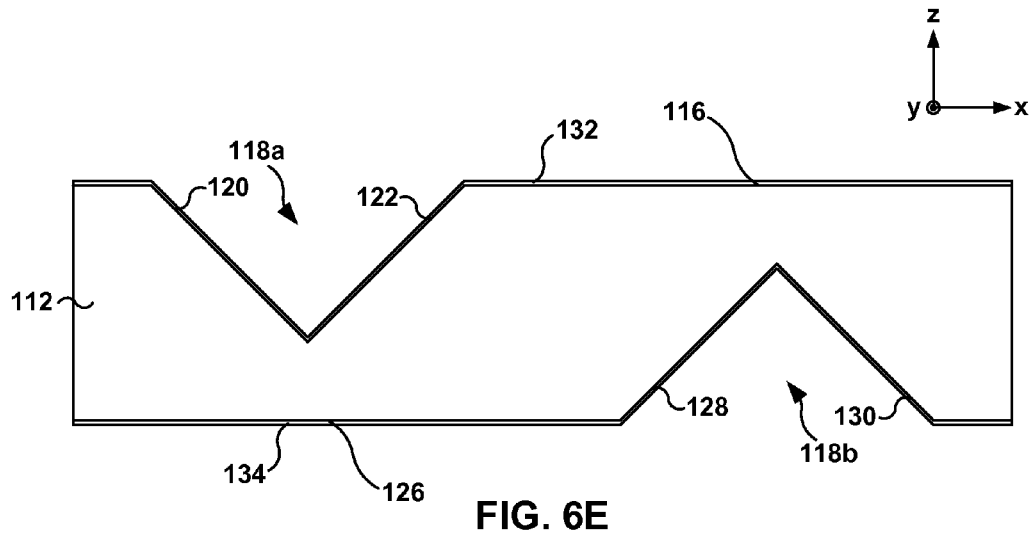

After second trench 128b has been formed, the technique continues with depositing metal layers on at least some of sloped walls 120, 122, 128, and 130 (96). As described above with respect to FIGS. 1 and 2C, metal may be deposited on first sloped wall 120, second sloped wall 122, third sloped wall 128, and, optionally, on fourth sloped wall 130. As shown in FIG. 6E, a first metal layer 132 may be deposited on first sloped wall 120 and second sloped wall 122, and a second metal layer 134 may be deposited on third sloped wall 128 and fourth sloped wall 130. In some instances, first metal layer 132 may also be deposited over at least a portion of first surface 116 and/or second metal layer 134 may be deposited over at least a portion of second surface 126. In some examples, first metal layer 132 and/or second metal layer 134 may be deposited directly on substrate 112, e.g., directly on the silicon. In other examples, a layer of electrical insulator, such as silicon oxide, first may be formed on at least a portion of substrate 112, e.g., on the horizontal surfaces of first surface 116 and/or second surface 126, and first metal layer 132 and/or second metal layer 134 may be deposited on at least some portions of the layer of insulator.

First metal layer 132 and/or second metal layer 134 may function as an electrical contact for a voltage supply during subsequent processing, a mirror for reflecting light radiation, and/or a mask for preventing etching of covered portions of substrate 112, as will be described below.

Figure 6F:
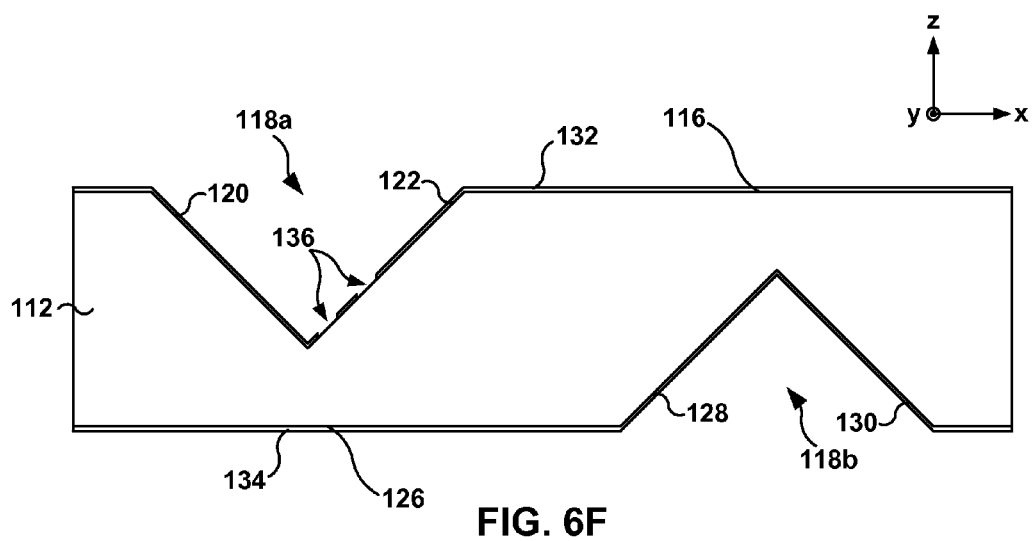

After depositing first and second metal layers 132 and 134 (96) on top of insulator or silicon, a plurality of apertures 136 may be formed in first metal layer 132 over second sloped wall 122 (98), as shown conceptually in FIG. 6F. Although two apertures 136 are shown in FIG. 6F, in other examples, more than two apertures, such as at least two apertures, may be formed in first metal layer 132 over second sloped wall 122. As described above, using a masking and etching process. Apertures 136 may correspond to locations at which substrate 112 may be etched to form fluidic channels in substrate 112.

Figure 6G:
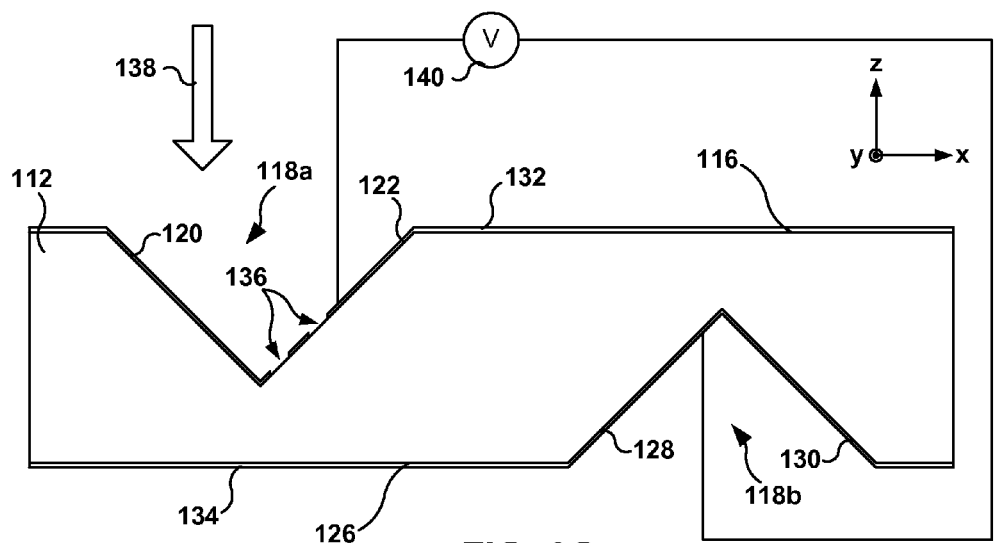
Figure 6H:
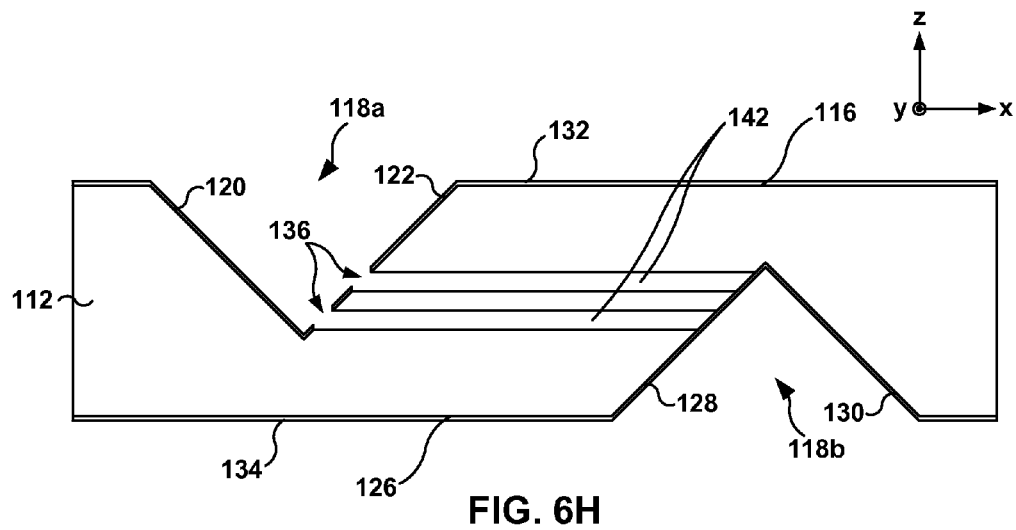

The technique of FIG. 5 also may include etching a plurality of channels between first trench 118a and second trench 118b (100), shown conceptually in FIGS. 6G and 6H. In some examples, the exposed surface of substrate 112 not to be etched and not covered in by first metal layer 132 or second metal layer 134 may be masked with an oxide or other insulator to prevent etching of these portions of substrate 112. The etching process may be performed by exposing uncovered surfaces of substrate 112 to a chemical etchant at apertures 136. In some examples, the etchant includes hydrofluoric acid.

As shown in FIG. 6G, the etching process may include attaching a voltage source 140 between a first electrode proximate to first metal layer 132 at first trench 118a and a second electrode electrically coupled to second metal layer 134 at second trench 118b. In some examples, the second electrode electrically coupled to second metal layer 134 at second trench 118b may act as an anode and the first electrode proximate to first metal layer 132 at first trench 118a may act as a cathode when the voltage is supplied from voltage source 140.

Etching the plurality of channels between first trench 118a and second trench 118b (100) also can include directing light radiation 138 (e.g., light) at first sloped wall 120. As first metal layer 132 may be reflective, first metal layer 132 at first sloped wall 120 may reflect at least some of light radiation 138 towards apertures 136. In some examples, the angle of first sloped wall 120 and the angle of incidence of light radiation 138 may be selected such that at least some of the radiation reflected by first metal layer 132 at first sloped wall 120 is directed toward apertures 136 in a direction substantially parallel to first surface 116 and second surface 126 (e.g., substantially parallel to the x-axis in FIG. 6G, where orthogonal x-y-z axes are shown in FIG. 6G for purposes of illustration only).

The combination of the applied voltage difference and the reflected light radiation 138 may influence the direction of etching when substrate 112 is exposed to the chemical etchant. For example, the electric field generated by the applied voltage between the first electrode proximate to first metal layer 132 at first trench 118a and the second electrode electrically coupled to second metal layer 134 at second trench 118b may influence the direction of etching as the chemical etchant, causing the etching to occur in a direction substantially parallel to first surface 116 and/or second surface 126 between apertures 136 and second trench 118b. Similarly, the reflected light radiation 138 may activate the chemical etchant, and may be directed substantially parallel to first surface 116 and/or second surface 126. As shown in FIG. 6H, this may result in a plurality of channels 142 formed in substrate 112. Each of the plurality of channels 142 extends from a respective one of apertures 136 to second metal layer 134 at third sloped wall 128. Channels 142 may extend substantially parallel (e.g., parallel or nearly parallel) to first surface 116 and/or second surface 126 (e.g., in the x-axis direction of FIG. 6H, where orthogonal x-y-z axes are shown for purposes of illustration only).

Figure 6I:
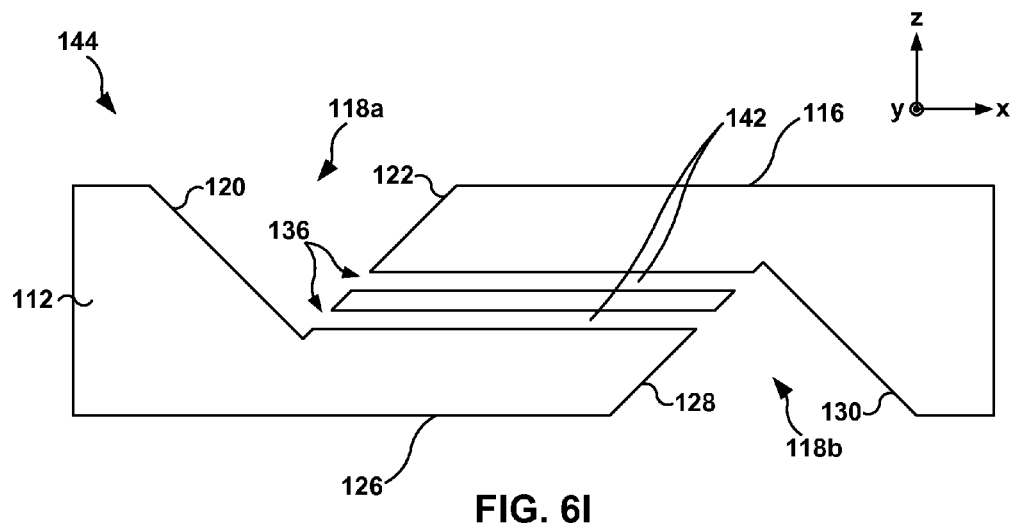

Once channels 142 have been etched in substrate 112, first metal layer 132 and second metal layer 134 may be removed from substrate 112 (102), using, for example, wet etching with a chemical etchant selective for the metal(s) which first metal layer 132 and second metal layer 134 comprise. The resulting cooling device 144 is shown in FIG. 6I. As shown in FIG. 6I, channels 142 extend between first trench 118a and second trench 118b, and lie substantially parallel to first surface 116 and second surface 126.

Figure 7:
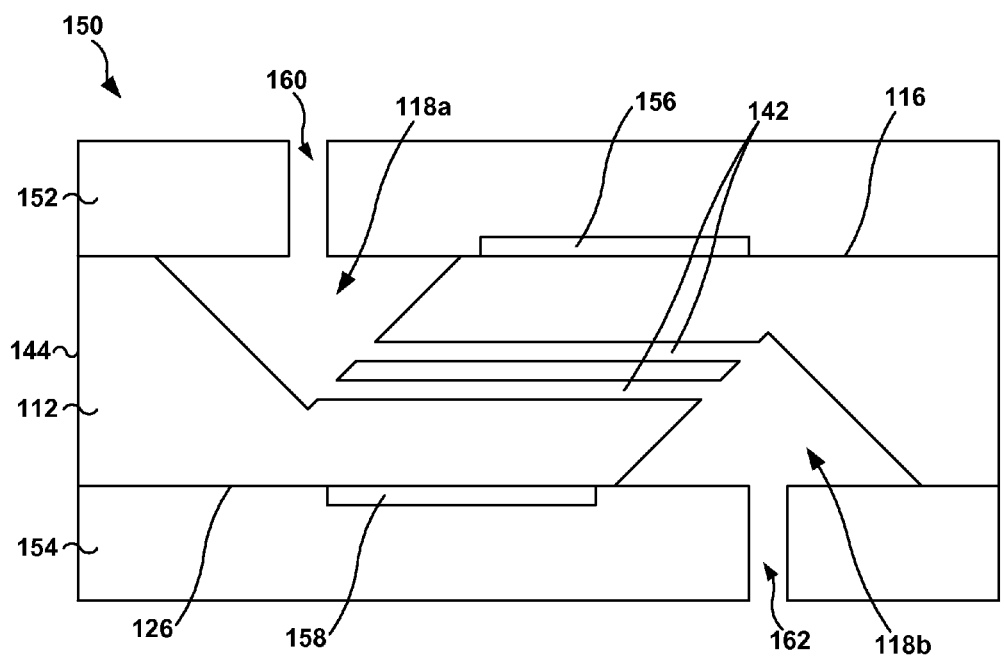
FIG. 7 is a conceptual and schematic block diagram illustrating an example of a cooling device implemented in an open system.

In some examples, cooling device 144 may be attached to at least one other substrate to form a cooling system. For example, FIG. 7 is a conceptual and schematic block diagram illustrating cooling device 144 implemented in an open cooling system 150. In the example of FIG. 7, cooling device 144 is attached to a second substrate 152 and a third substrate 154. Second substrate 152 may be attached to first surface 116 of cooling device 144, and may define a first channel 160. First channel 160 may fluidly connect to a fluid source or fluid sink (which may be the same structure in some examples, such as a coolant reservoir).

Second substrate 152 may be a substrate of a microelectronic device, and includes first heat-generating area 156, which may include heat-generating circuitry, such as transistors or the like. As shown in FIG. 7, first heat-generating area 156 is adjacent to channels 142 (e.g., is located adjacent to first surface 116 between first trench 118a and second trench 118b). This allows heat to be transferred from first heat-generating area 156 to substrate 112 of cooling device 114. Substrate 112 may include a thermally conductive material, such as silicon, and may thus be an effective heat sink. Heat in substrate 112 may be transferred to a coolant flowing through channels 142 (e.g., flowing from first trench 118a to second trench 118b or vice versa). In this way, cooling device 144 may be a cooling device for first heat-generating area 156.

Third substrate 154 may be attached to second surface 126 of cooling device 144, which is substantially opposite to and substantially parallel to first surface 116 of cooling device 144. Third substrate 154 may be a substrate of a microelectronic device, and includes second heat-generating area 158, which may include heat-generating circuitry, such as transistors or the like. As shown in FIG. 7, second heat-generating area 158 is adjacent to channels 142 (e.g., is located adjacent to second surface 126 between first trench 118a and second trench 118b). This allows heat to be transferred from second heat-generating area 158 to substrate 112 of cooling device 144. Heat in substrate 112 may be transferred to a coolant flowing through channels 142. In this way, cooling device 144 also may be a cooling device for second heat-generating area 158.

Third substrate 154 also may define a second channel 162. Second channel 162 may fluidly connect to a fluid source or fluid sink (which may be the same structure in some examples, such as a coolant reservoir).

In some examples, cooling system 150 may be designed such that it is a single-phase cooling system, in which the cooling fluid exists as substantially a single phase (e.g., liquid or gas) throughout the cooling system. In other examples, cooling system 150 may be designed such that it is a multi-phase (e.g., dual-phase) cooling system, in which the cooling fluid changed phases (e.g., from liquid to gas) as the cooling fluid flows through channels 142, and then is cooled to return to the liquid phase, e.g., at the reservoir or an external radiator.

Various examples have been described. These and other examples are within the scope of the following claims.

What is claimed is:

1. A cooling system comprising:
a substrate defining a first trench, a second trench, and a plurality of channels extending between the first trench and the second trench, wherein the substrate defines a first surface and a second surface substantially opposite to and substantially parallel to the first surface, and wherein each of the plurality of channels extends substantially parallel to the surface of the substrate;
a microelectronic device comprising a heat-generating area, wherein the microelectronic device is attached to the first surface or the second surface of the substrate, and the heat-generating area is adjacent to the first surface or the second surface and at a position between the first trench and the second trench.

2. The cooling system of claim 1, wherein the first trench is formed in the first surface and the second trench is formed in the second surface.

3. The cooling system of claim 1, wherein the first trench and the second trench are formed in the first surface.

4. The cooling system of claim 1, wherein the microelectronic device is attached to the second surface of the substrate, the cooling system further comprising a second substrate attached to the first surface of the substrate, wherein the second substrate defines a first channel and a second channel, and wherein the first channel is fluidly coupled to the first trench and the second channel is fluidly coupled to the second trench.

5. The cooling system of claim 1, wherein the microelectronic device is attached to the first surface of the substrate, the cooling system further comprising a second substrate attached to the first surface of the substrate, wherein the second substrate defines a first channel, a second channel, and a cavity fluidly connected to the first channel and the second channel, and wherein the first channel is fluidly coupled to the first trench and the second channel is fluidly coupled to the second trench.

6. The cooling system of claim 1, wherein the microelectronic device comprises a first microelectronic device and is attached to the first surface of the substrate, the cooling system further comprising a second microelectronic device attached to the second surface, wherein the second microelectronic device comprises a second heat-generating area, and wherein the second heat-generating area is disposed adjacent to the second surface and between the first trench and the second trench.

7. A system comprising:
a silicon substrate defining a first trench and a second trench, wherein the first trench comprises a first sloped wall and a second sloped wall, wherein the second trench comprises a third sloped wall and a fourth sloped wall, and wherein the second sloped wall is adjacent to the third sloped wall;
a first metal layer formed on the first sloped wall and the second sloped wall, wherein the first metal layer defines a plurality of apertures adjacent to the second sloped wall; and
a second metal layer formed on the third sloped wall.

8. The system of claim 7, wherein the first trench is defined in a first surface of the silicon substrate and the second trench is defined in a second surface of the silicon substrate, wherein the first surface is substantially opposite to and substantially parallel to the second surface.

9. The system of claim 7, wherein the first trench and the second trench are defined in a first surface of the silicon substrate.

10. The system of claim 7, further comprising:
a light source;
a voltage source;
a first electrode electrically coupled to the voltage source and disposed adjacent to the first metal layer; and
a second electrode electrically coupled to the voltage source and electrically connected to the second metal layer.

* * * * *